(12) United States Patent
Zhu et al.

(10) Patent No.: US 7,280,058 B1
(45) Date of Patent: Oct. 9, 2007

(54) MIXED-SIGNAL SYSTEM-ON-A-CHIP ANALOG SIGNAL DIRECT INTERCONNECTION THROUGH PROGRAMMABLE LOGIC CONTROL

(75) Inventors: Limin Zhu, Fremont, CA (US); Theodore Speers, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/465,530

(22) Filed: Aug. 18, 2006

(51) Int. Cl.
*H03M 1/00* (2006.01)
(52) U.S. Cl. ..................................... 341/110; 341/172
(58) Field of Classification Search ......... 341/110–172
See application file for complete search history.

(56) References Cited

U.S. PATENT DOCUMENTS 6,414,619 B1 * 7/2002 Swanson .................... 341/139
6,967,611 B2 * 11/2005 Atriss et al. ................. 341/172

* cited by examiner

*Primary Examiner*—Lam T. Mai
(74) *Attorney, Agent, or Firm*—Sierra Patent Group, Ltd.

(57) ABSTRACT

A programmable analog circuit includes a plurality of analog inputs, a differential analog buffer, a digital-to-analog converter, an analog-to-digital converter, and an operational amplifier having an inverting input and a non-inverting input. An analog switching network is coupled between the plurality of analog inputs, the differential analog buffer, the digital-to-analog converter, the analog-to-digital converter, and the operational amplifier and is configured to allow programmable connections from any of the plurality of analog inputs, the differential analog buffer, and the digital-to-analog converter to the inverting input and a non-inverting input; of the operational amplifier. An array of programmable logic is programmably coupled to the input to the digital-to-analog converter and the output of the analog-to-digital converter.

6 Claims, 3 Drawing Sheets

MIXED-SIGNAL SYSTEM-ON-A-CHIP ANALOG SIGNAL DIRECT INTERCONNECTION THROUGH PROGRAMMABLE LOGIC CONTROL

BACKGROUND OF THE INVENTION

1. Field of the Invention

The present invention relates to integrated circuits. More particularly, the present invention relates to a mixed-signal system-on-a-chip integrated circuit having analog signal direct interconnection through programmable logic control.

2. The Prior Art

System designers usually employ discrete devices to build closed-loop analog feedback systems including analog-to-digital converters (ADC) and digital-to-analog converters (DAC). Some products have both ADC and DAC circuits disposed on one chip; however, the signal path inside the chip is analog to digital through the ADC, then digital to analog through the DAC. In between the ADC and the DAC, there is a generally a microcontroller to process digital data.

BRIEF DESCRIPTION OF THE INVENTION

According to one aspect of the present invention, a closed-loop analog feedback system includes an ADC and a DAC. A programmable analog signal path inside the chip permits direct analog signal interconnection between the ADC analog input and the DAC analog output. A programmable analog circuit includes a plurality of analog inputs, a differential analog buffer, a digital-to-analog converter, an analog-to-digital converter, and an operational amplifier having an inverting input and a non-inverting input. An analog switching network is coupled between the plurality of analog inputs, the differential analog buffer, the digital-to-analog converter, the analog-to-digital converter, and the operational amplifier and is configured to allow programmable connections from any of the plurality of analog inputs, the differential analog buffer, and the digital-to-analog converter to the inverting input and a non-inverting input; of the operational amplifier. An array of programmable logic is programmably coupled to the input to the digital-to-analog converter and the output of the analog-to-digital converter.

Use of the present invention permits direct analog signal interconnection between the ADC analog input and the DAC analog output. It also allows both fixed-gain set by an internal resistor ratio or a specific gain set by an external resistor ratio. It also permits analog signal impedance control and offset compensation. An on-chip MOSFET permits conversion of a voltage signal to a current signal. The present invention also includes an analog-signal feedback system configuration for self-calibration.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention allows designers to implement analog signal fixed or flexible gain control, analog signal output impedance control, analog signal offset compensation, analog voltage or current signal conversion, analog closed-loop feedback system implementation, and analog system calibration.

The present invention allows analog input signals to be connected directly to the output stage of an on-chip DAC, which implements the total analog signal interconnection. This functionality is controlled by on-chip Flash FPGA logic.

Figure 1:
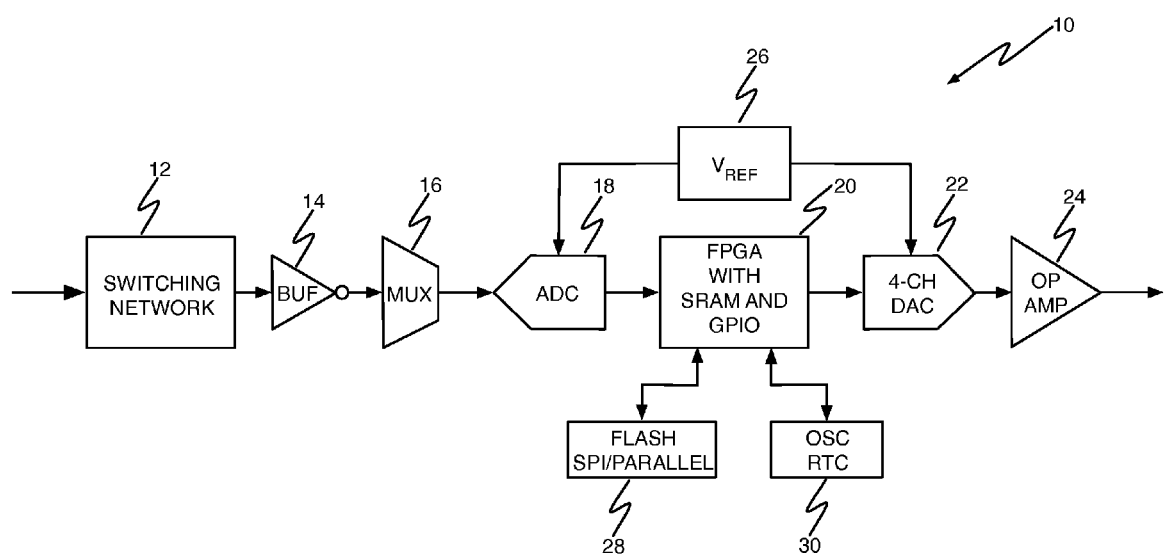
FIG. 1 is a block diagram of an illustrative mixed analog and digital system on a chip according to the present invention.

Referring first to FIG. 1, block diagram of an illustrative mixed analog and digital system on a chip 10 according to the present invention includes multi-channel analog input stage 12, analog input buffer 14 and multiplexer 16, a high-resolution configurable ADC 18, flash FPGA core 20 with embedded SRAM and general purpose input/output, a multi-channel voltage or current DAC 22 with an analog output operational amplifier 24. Either an on-chip or off-chip voltage reference shown at reference numeral 26 is provided for the ADC and DAC. Other components include embedded flash memory 28 and an integrated clock system 30 including an oscillator and a real-time clock.

Figure 2:
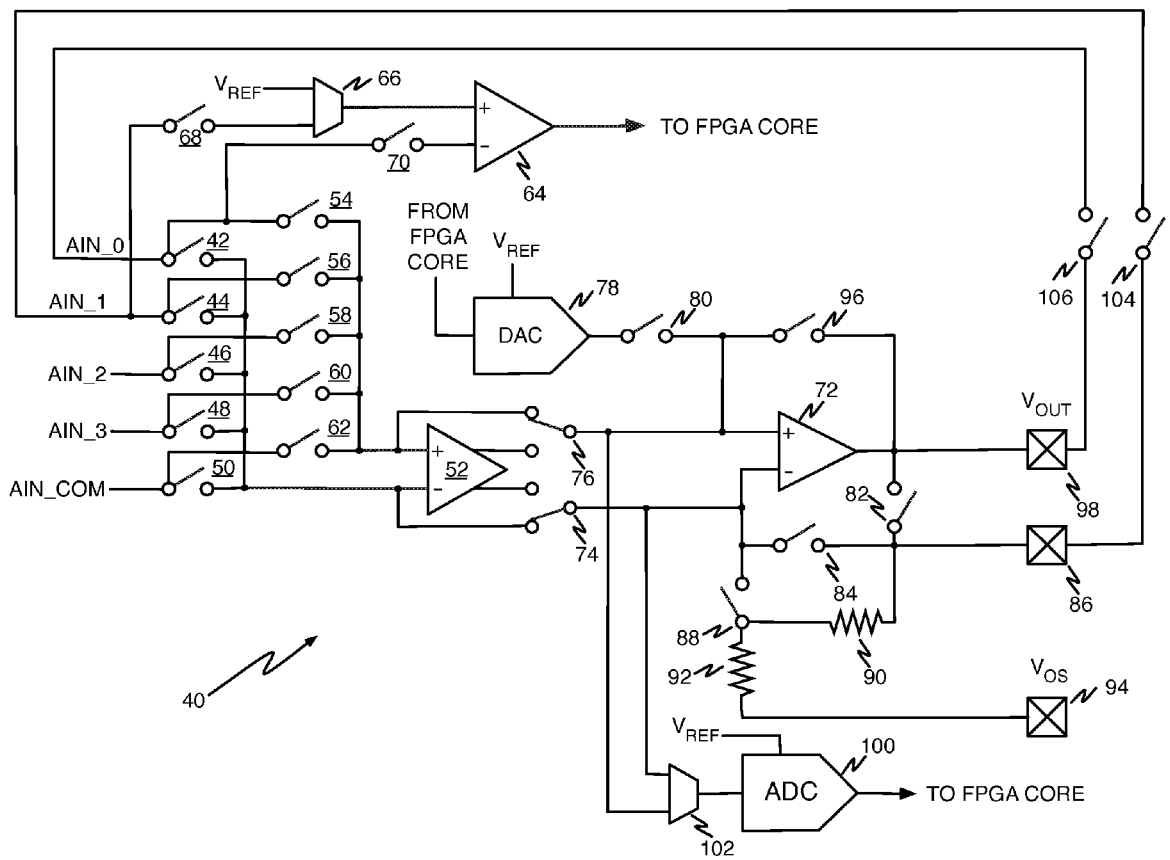
FIG. 2 is a schematic diagram of a direct voltage signal link embodiment according to the present invention.

Referring now to FIG. 2, a schematic diagram shows an illustrative direct voltage signal link embodiment 40 according to the present invention. The embodiment shown in FIG. 2 includes analog inputs AIN_0 through AIN_3 as well as an analog common input AIN_COM. These analog inputs are fed to a first bank of switches in which switch 42 is coupled to analog input AIN_0, switch 44 is coupled to analog input AIN_1, switch 46 is coupled to analog input AIN_2, switch 48 is coupled to analog input AIN_3, and switch 50 is coupled to analog input AIN_COM. The switches 42, 44, 46, 48, and 50 may be selectively closed to couple any one of the analog inputs to the inverting input of buffer amplifier 52.

The analog inputs are also fed to a second bank of switches in which switch 54 is coupled to analog input AIN_0, switch 56 is coupled to analog input AIN_1, switch 58 is coupled to analog input AIN_2, switch 60 is coupled to analog input AIN_3, and switch 62 is coupled to analog input AIN_COM. The switches 54, 56, 58, 60, and 62 may be selectively closed to couple any one of the analog inputs to the non-inverting input of buffer amplifier 52.

Analog comparator 64 compares the analog voltage at analog input AIN_0 with either the analog voltage at analog input AIN_1 or with a reference voltage $V_{REF}$ as selected by multiplexer 66. Switches 68 and 70, respectively, connect analog input AIN_1 to one input of the multiplexer 66 and input AIN_0 to the inverting input of the analog comparator 64. The output of analog comparator 64 is a digital signal that is fed into the FPGA core.

There is a choice of multiple the inverting and non-inverting inputs of operational amplifier 72. The inverting and non-inverting inputs of operational amplifier 72 may be sourced, respectively, from the outputs of the first and second switch banks, or the differential outputs of buffer 52 through double-throw switches 74 and 76, respectively.

DAC 78 is driven by a digital input from the FPGA core as shown in FIG. 2 and uses a VREF signal to set the analog output voltage as is known in the art. Its output may be directed to the non-inverting input of operational amplifier 72 through switch 80. The digital value is supplied to the input of DAC 78 from the FPGA core. In addition, an ADC 100 is driven from the output of multiplexer 102, which selects an input from either the output of switch 74 or the output of analog switch 76. The output of ADC 100 is fed to the FPGA core.

There are several feedback loops that may be implemented for operational amplifier 72. Its output may be fed back to its inverting input by closing switches 82 and 84 to configure operational amplifier 72 as a unity-gain follower. Closing only switch 82 places the output of operational amplifier 72 onto I/O pad 86 and closing only switch 84 places either the output of the first switch bank or the negative differential output of the buffer 52 onto I/O pad 86. Closing switches 82 and 88 and leaving switch 84 open places resistor 90 between the output of operational amplifier 72 and its inverting input and places resistor 92 between the inverting input of operational amplifier 72 and I/O pad 94. This configuration may be employed to set the gain of operational amplifier 72. Closing switch 96 connects the output of operational amplifier 72 to its non-inverting input. I/O pad 98 is hardwired to the output of operational amplifier 72. Closing switch 104 couples I/O pad 86 to analog input AIN_1. Closing switch 106 couples I/O pad 98 to analog input AIN_0. Other combinations of switch activations to perform analog functions with the circuit of FIG. 2 will be apparent to persons of ordinary skill in the art.

Figure 3:
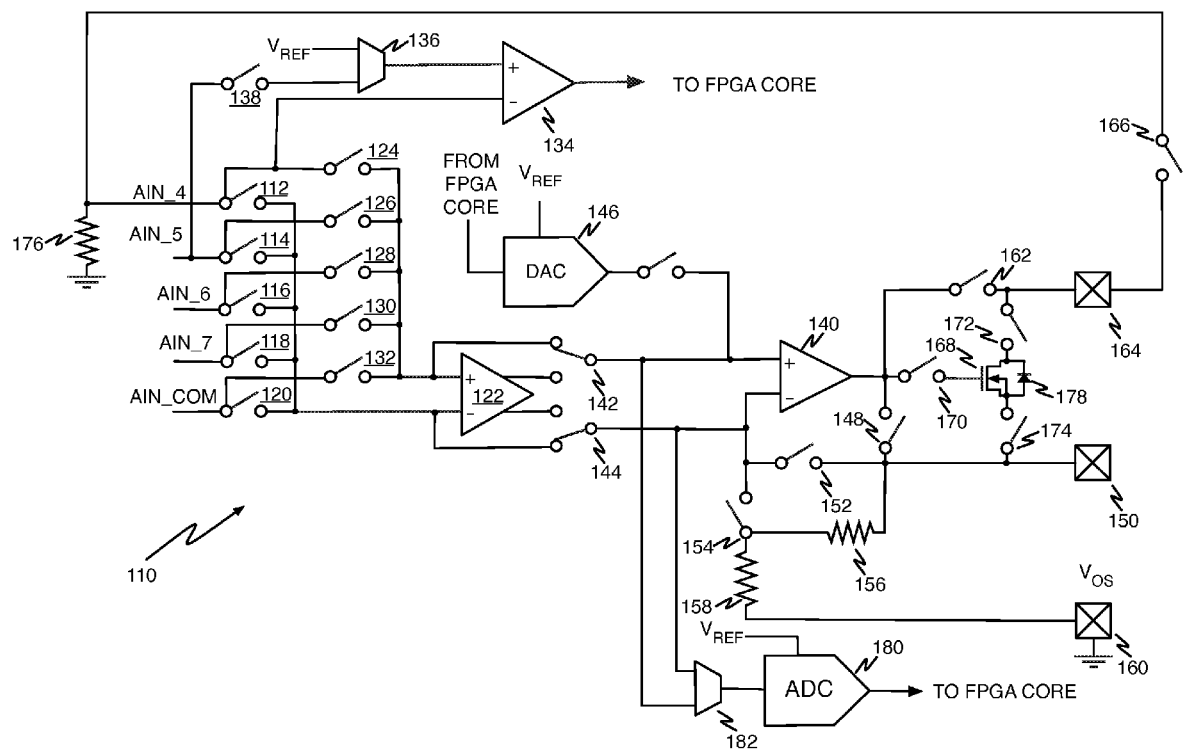
FIG. 3 is a schematic diagram of a direct current signal link embodiment according to the present invention.

Referring now to FIG. 3, a schematic diagram shows an illustrative direct current signal link embodiment 110 according to the present invention. The embodiment shown in FIG. 3 includes analog inputs AIN_4 through AIN_7 as well as an analog common input AIN_COM. These analog inputs are fed to a first bank of switches in which switch 112 is coupled to analog input AIN_4, switch 114 is coupled to analog input AIN_5, switch 116 is coupled to analog input AIN_6, switch 118 is coupled to analog input AIN_7, and switch 120 is coupled to analog input AIN_COM. The switches 112, 114, 116, 118, and 120 may be selectively closed to couple any one of the analog inputs to the inverting input of buffer amplifier 122.

The analog inputs are also fed to a second bank of switches in which switch 124 is coupled to analog input AIN_4, switch 126 is coupled to analog input AIN_5, switch 128 is coupled to analog input AIN_6, switch 130 is coupled to analog input AIN_7, and switch 132 is coupled to analog input AIN_COM. The switches 124, 126, 128, 130, and 132 may be selectively closed to couple any one of the analog inputs to the non-inverting input of buffer amplifier 122.

Analog comparator 134 compares the analog voltage at analog input AIN_4 with either the analog voltage at analog input AIN_5 or with a reference voltage $V_{REF}$ as selected by multiplexer 136. Switch 138 connects analog input AIN_5 to one input of the multiplexer 136. The output of analog comparator 134 is a digital signal that is fed into the FPGA core.

There is a choice of multiple source for the inverting and non-inverting inputs of operational amplifier 140. The inverting and non-inverting inputs of operational amplifier 140 may be sourced, respectively, from the outputs of the first and second switch banks, or the differential outputs of buffer 122 through double-throw switches 142 and 144, respectively.

DAC 146 is driven by a digital input signal and its output is coupled to the non-inverting input of operational amplifier 140. The digital value is supplied to the input of DAC 146 from the FPGA core.

There are several feedback loops that may be implemented for operational amplifier 140. Its output may be fed back to its inverting input by closing switches 148 and 150 to configure operational amplifier 140 as a unity-gain follower. Closing only switch 148 places the output of operational amplifier 140 onto I/O pad 150 and closing only switch 152 places either the output of the first switch bank or the negative differential output of the buffer 122 onto I/O pad 150. Closing switches 148 and 154 and leaving switch 152 open places resistor 156 between the output of operational amplifier 140 and its inverting input and places resistor 158 between the inverting input of operational amplifier 140 and I/O pad 160. This configuration may be employed to set the gain of operational amplifier 140. Closing switch 162 connects the output of operational amplifier 140 to I/O pad 164 as well as to analog input AIN_4. I/O pad 164 may be connected to analog input AIN_4 by closing switch 166.

The output of operational amplifier 140 may be coupled to the gate of n-channel MOS transistor 168 by closing switch 170. If switches 172 and 174 are closed and switch 162 is left open, a current proportional to the output voltage of operational amplifier 140 will flow between I/O pad 150 and ground through resistor 176, which will then provide a voltage proportional to that current to analog input AIN_4. Diode 178 is included to prevent reverse current from flowing. Other combinations of switch activations to perform analog functions with the circuit of FIG. 3 will be apparent to persons of ordinary skill in the art.

In addition, an ADC 180 is driven from the output of multiplexer 182, which selects an input from either the output of switch 142 or the output of analog switch 144. The output of ADC 180 is fed to the FPGA core.

The switches shown in FIGS. 2 and 3 are analog switches that may be controlled from the FPGA core. These analog switches may be formed from CMOS passgates as is known in the art.

As shown in both FIG. 2 and FIG. 3, the ADC analog inputs, either through or bypassing the analog input buffer amplifier, can be programmed to connect directly to the DAC output buffers. This method can offer a fixed-gain set by the internal resistor ratio or a specific gain set by an external resistor ratio. This method also offers analog output impedance control and voltage/current conversion through on-chip N-channel MOS transistor 156 (FIG. 3). FIG. 2 and FIG. 3, respectively, show that the voltage and current outputs of VDAC or IDAC may be linked back to the input channels of the ADC to configure a feedback system. This configuration may be employed by a user to perform signal calibration or monitoring.

FIG. 2 and FIG. 3 show a one-channel analog signal direct link configuration. Since multiple DAC channels are possible, a user can employ some or all of them for analog signal direct link implementation.

With both integrated ADC and DAC converters, the present invention is capable of interfacing with various analog or digital signals and is a self-sustained closed-loop mixed-signal processing platform. In addition to the direct analog signal acquisition by the ADC and a dedicated analog signal driven out by the DAC, the outputs of the DAC of the present invention can also be connected to the inputs of an on-chip ADC.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A programmable mixed digital and analog circuit including:
    a plurality of analog inputs;
    a differential analog buffer;
    a digital-to-analog converter;
    an analog-to-digital converter;
    an operational amplifier having an inverting input and a non-inverting input;
    an analog switching network coupled between the plurality of analog inputs, the differential analog buffer, the digital-to-analog converter, the analog-to-digital converter, and the operational amplifier configured to allow programmable connections from any of the plurality of analog inputs, the differential analog buffer, and the digital-to-analog converter to the inverting input and a non-inverting input; of the operational amplifier; and
    an array of programmable logic programmably coupled to the input to the digital-to-analog converter and the output of the analog-to-digital converter.

2. The programmable mixed digital and analog circuit of claim 1 further including an analog comparator having inputs programmably connectable to at least a subset of the plurality of analog inputs.

3. The programmable mixed digital and analog circuit of claim 2 wherein the analog comparator has at least one input programmably connectable to an analog reference voltage source.

4. The programmable mixed digital and analog circuit of claim 1 wherein the gain of the operational amplifier is programmable.

5. The programmable mixed digital and analog circuit of claim 1 further including a programmable analog feedback path between the output of the operational amplifier and at least one of the plurality of analog inputs.

6. The programmable mixed digital and analog circuit of claim 1 wherein the amplifying configuration of the operational amplifier is programmable.

* * * * *